United States Patent
McDonald et al.

(10) Patent No.: US 9,510,638 B2
(45) Date of Patent: Dec. 6, 2016

(54) SECUREMENT STRAP FOR A SANDAL

(71) Applicant: Luna Sandals, LLC, Seattle, WA (US)

(72) Inventors: Ted McDonald, Seattle, WA (US); Scott Smuin, Seattle, WA (US); Brandon Smuin, Seattle, WA (US); Philip B. Stark, Berkeley, CA (US)

(73) Assignee: LUNA SANDALS, Seattle, WA (US)

( * ) Notice: Subject to any disclaimer, the term of this patent is extended or adjusted under 35 U.S.C. 154(b) by 0 days.

(21) Appl. No.: 14/587,580

(22) Filed: Dec. 31, 2014

(65) Prior Publication Data

US 2016/0007673 A1    Jan. 14, 2016

Related U.S. Application Data

(63) Continuation-in-part of application No. 14/328,339, filed on Jul. 10, 2014, now Pat. No. 9,318,556.

(51) Int. Cl.
| | |
|---|---|
| A43B 3/12 | (2006.01) |
| A43C 11/14 | (2006.01) |
| H01L 29/78 | (2006.01) |
| H01L 29/16 | (2006.01) |

(52) U.S. Cl.
CPC ............... *A43B 3/126* (2013.01); *A43B 3/12* (2013.01); *A43B 3/122* (2013.01); *A43B 3/128* (2013.01); *A43C 11/1493* (2013.01); *H01L 29/1606* (2013.01); *H01L 29/78* (2013.01)

(58) Field of Classification Search
CPC ....... A43B 13/10; A43B 13/12; A43B 13/122; A43B 13/126; A43B 3/26; A43B 3/242; A43B 3/244; A43B 3/10; A43B 3/12; A43B 3/122; A43B 3/126; A43C 11/1493

USPC .............................. 36/88, 97, 100, 101, 11.5
See application file for complete search history.

(56) References Cited

U.S. PATENT DOCUMENTS

| | | | | |
|---|---|---|---|---|
| 2,367,092 | A * | 1/1945 | Blotner ........................ | 36/11.5 |
| 5,423,134 | A * | 6/1995 | Bagnaia et al. ............... | 36/11.5 |
| 5,463,823 | A * | 11/1995 | Bell et al. ...................... | 36/11.5 |
| 6,247,983 | B1 * | 6/2001 | Yeh ................................ | 441/64 |
| 6,435,926 | B1 * | 8/2002 | Yeh ................................ | 441/64 |
| 6,516,538 | B2 * | 2/2003 | Kraft ............................ | 36/11.5 |
| 7,823,299 | B1 * | 11/2010 | Brigham ........................ | 36/101 |
| 8,381,415 | B1 * | 2/2013 | Lanoue et al. ................. | 36/11.5 |
| 8,839,529 | B1 * | 9/2014 | Levy ............................. | 36/11.5 |
| 8,875,417 | B2 * | 11/2014 | Alberi .................... | A43B 3/244 36/100 |
| 2003/0009909 | A1 * | 1/2003 | Chen ........................... | 36/11.5 |
| 2005/0252036 | A1 * | 11/2005 | Laska .......................... | 36/11.5 |
| 2007/0204483 | A1 * | 9/2007 | Kirsch et al. ................. | 36/11.5 |

(Continued)

*Primary Examiner* — Khoa Huynh
*Assistant Examiner* — Sharon M Prange
(74) *Attorney, Agent, or Firm* — Soquel Group LLC

(57) ABSTRACT

A sandal including a sole having a front region and a back region and an interior side and an exterior side, having a first opening in or near the back region at the interior side and a second opening in or near the back region at the exterior side. A primary strap is threaded through the first opening, then looped around the back region, and threaded through the second opening, thereby defining a heel region of the primary strap between the first opening and the second opening. The sandal further includes an adjustable securement strap that attaches on one side to the interior side of the heel region of the primary strap and on the other side to the exterior side of the heel region of the primary strap.

13 Claims, 6 Drawing Sheets

(56) References Cited

U.S. PATENT DOCUMENTS

2010/0275462 A1* 11/2010 Pucci ............................ 36/102
2013/0160326 A1*  6/2013 Szekeresh .................... 36/102
2015/0335094 A1* 11/2015 Belshe et al. ................ 36/58.6

* cited by examiner

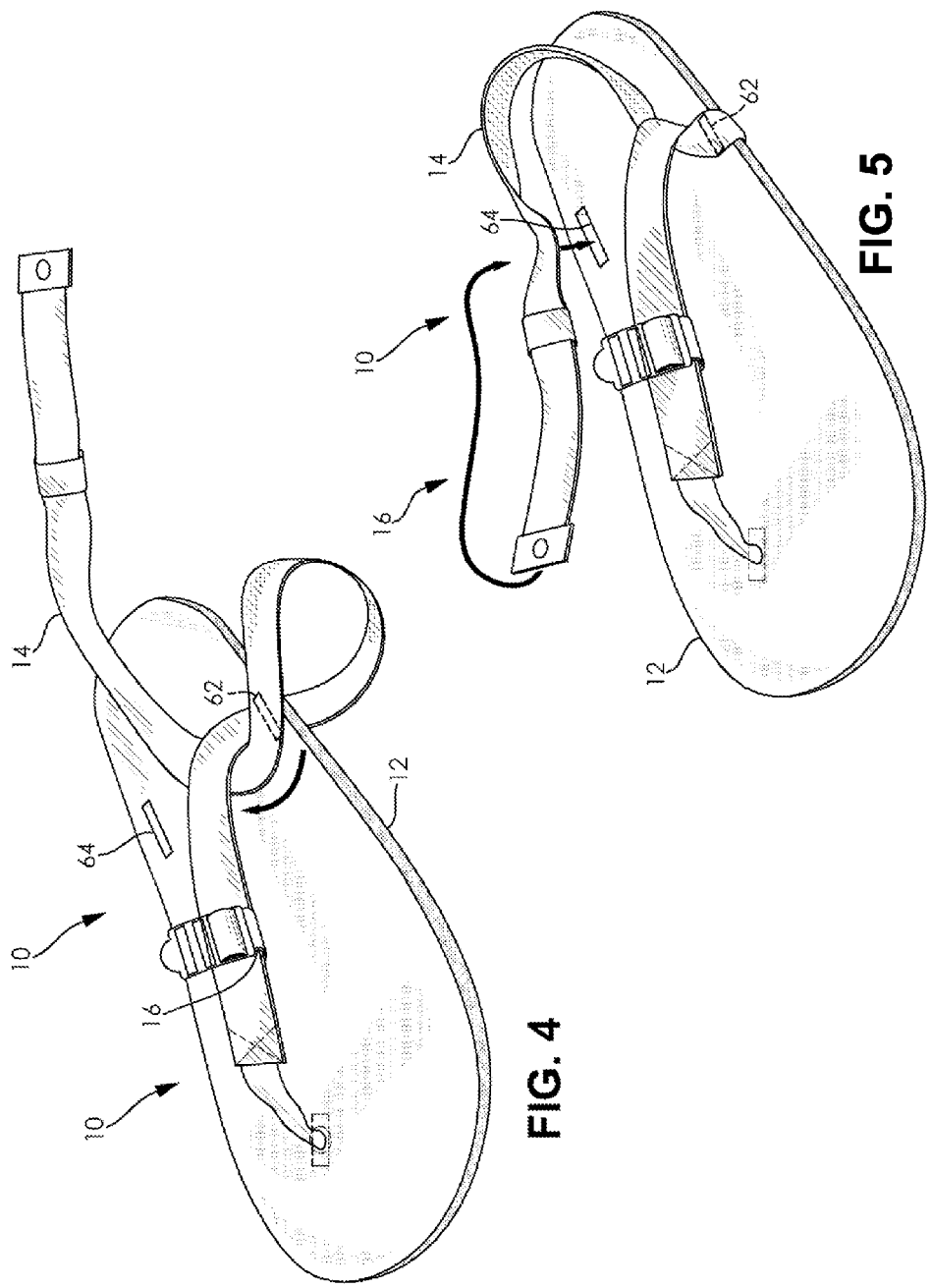

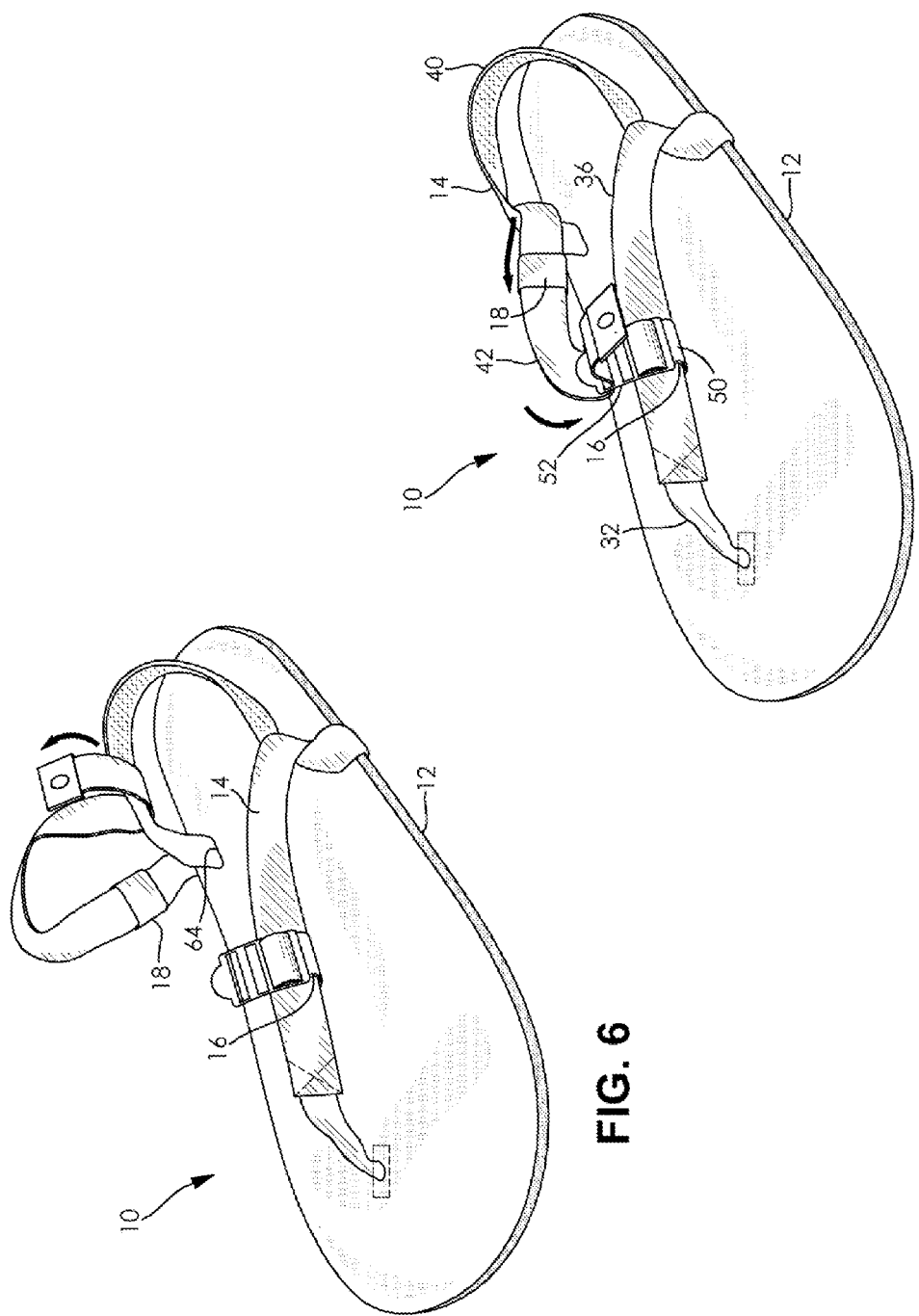

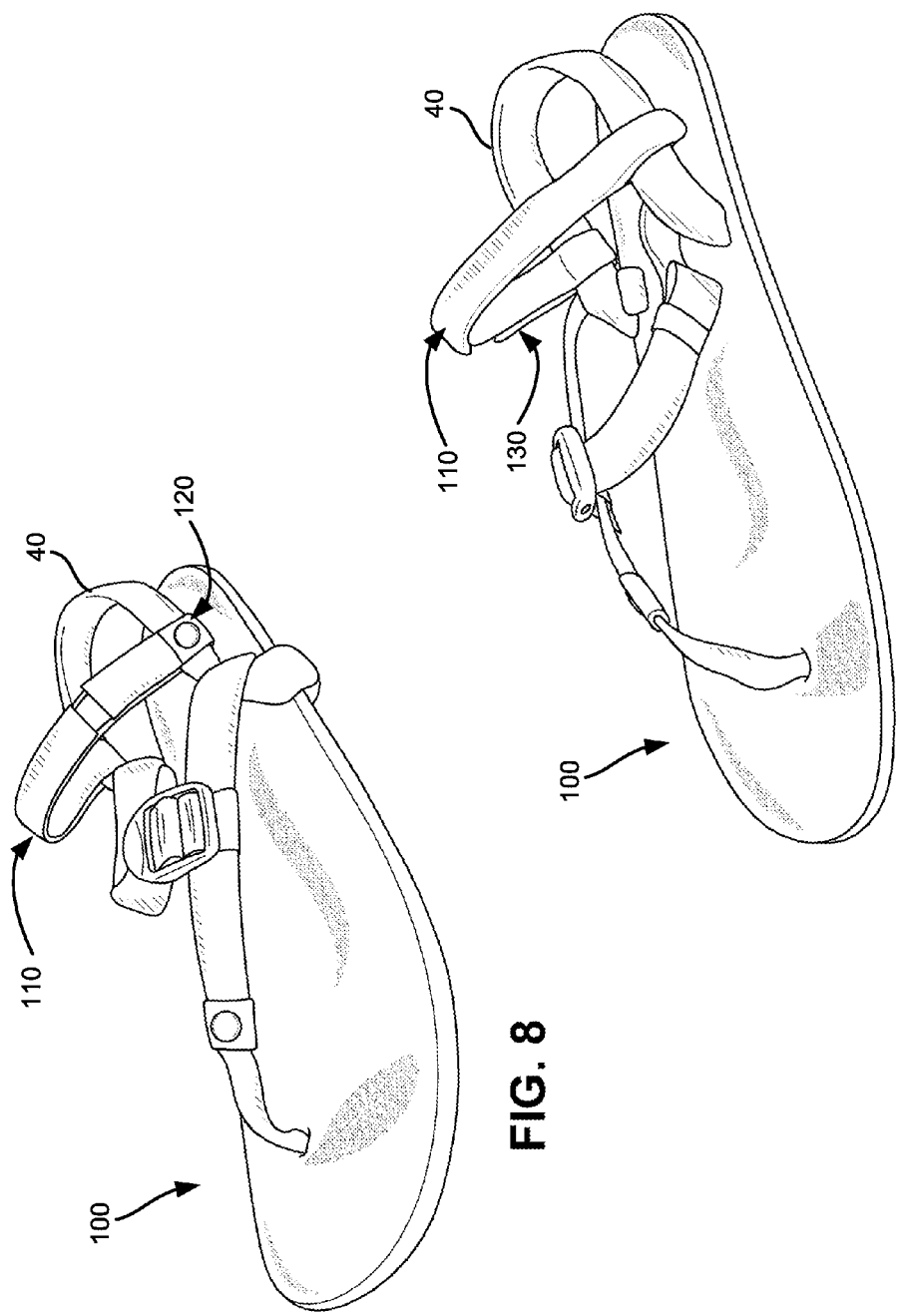

SECUREMENT STRAP FOR A SANDAL

PRIORITY CLAIM

This application is a continuation-in-part of U.S. patent application Ser. No. 13/687,425, entitled Naturally Adjusting Sandal, filed on Nov. 28, 2012 by inventors Ted McDonald et al.

FIELD OF THE INVENTION

The present invention relates to a securement strap for a sandal worn on the foot.

BACKGROUND

Typically, sandals, while protecting the foot from injuries that may be inflicted by sharp objects lying on the ground, do not provide a wearer with a sense of close contact between foot and earth. As a result, it is difficult for a runner wearing sandals to have a natural-feeling walking or running experience, i.e. an experience comparable to what a walker or runner might experience when running with bare feet.

To better approach a natural-feeling running experience, sandals have been used that employ a single strap that is threaded through holes in the sole to provide a complete encircling of the foot. However, the strap of such sandals is undifferentiated over its length, thereby ill-serving portions of the foot for which the dimensions of the strap are not well matched. In addition, many types of sandals use different straps for different parts of the foot, with buckles that are separately adjustable. This approach makes tightening up the sandal a complicated maneuver.

Therefore, it would be desirable to have a sandal adapted for running, walking or other purposes that uses a single strap with sections that are adapted to the requirements of the wearer's foot that are easily adjusted using a single buckle.

In practical use, it has been observed that the foot and ankle of a person using such a sandal can separate from the sole of the sandal in a way that some users find undesirable. For example, the sandal may flop against the heel of the foot. To secure the sandal to the foot and ankle a secondary strap, referred to herein as a securement strap, which fits across the ankle may be used. Adding the securement strap obviates some complaints made by wearers of a sandal that employs only a single strap.

There is thus a need for a securement strap that enables a user to secure a sandal more completely to the foot.

SUMMARY OF THE INVENTION

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In one embodiment, the present invention may take the form of a sandal that includes a sole having a front region, a back region, an interior side and an exterior side, including a first opening located in the front region, a second opening in or near the back region at the interior side and a third opening in or near the back region at the exterior side, and a strap, including of a plurality of sections, having a first end and a second end and wherein the first end is threaded upwardly through the front opening, through said second opening and looped around said back region, and through said third opening, thereby defining a heel region between the second opening and the third opening.

In a second embodiment, the present invention may take the form of a strap for a sandal including a front section at a first end of the strap that terminates in a stop-plug, the stop plug serving to retain the first end of the strap when it is inserted through an opening in the sandal, a heel section adjacent to the front section, a final instep section adjacent to the heel section, and a buckle assembly coupled to the final instep section that retains a second end of the strap, wherein the plurality of sections include at least two sections that are made of different materials.

In addition to the exemplary aspects and embodiments described above, further aspects and embodiments will become apparent by reference to the drawings and by study of the following detailed descriptions.

BRIEF DESCRIPTION OF THE DRAWINGS

Exemplary embodiments are illustrated in referenced drawings. It is intended that the embodiments and figures disclosed herein are to be considered illustrative rather than restrictive.

FIG. 4 is a top isometric view of the sandal of FIG. 1, in an initial stage of being laced.

FIG. 5 is a top isometric view of the sandal of FIG. 1 in a first intermediate stage of being laced.

FIG. 6 is a top isometric view of the sandal of FIG. 1 in a second intermediate stage of being laced.

FIG. 7 is a top isometric view of the sandal of FIG. 1 in a final stage of being laced.

FIG. 8 is an outside top isometric view of a sandal that includes a securement strap that crosses over the top of the foot.

FIG. 9 is an inside top isometric view of the sandal of FIG. 8.

DETAILED DESCRIPTION

The invention will be more completely understood through the following detailed description, which should be read in conjunction with the attached drawings. Detailed embodiments of the invention are disclosed herein, however, it is to be understood that the disclosed embodiments are merely exemplary of the invention, which may be embodied in various forms. Therefore, specific functional details disclosed herein are not to be interpreted as limiting, but merely as a basis for the claims and as a representative basis for teaching one skilled in the art to variously employ the invention in virtually any appropriately detailed embodiment.

It may be appreciated by one skilled in the art, that while a principal object of the subject invention is a sandal that is suited for running, the approach described herein is also suited for walking and other uses. Nothing disclosed herein is intended to limit the use of the sandal to running or any other particular use.

As used herein the following terms have the meanings given below:

The term user refers to a human that is wearing a sandal of the present invention. As used herein the term user is synonymous with the terms wearer and runner. In some cases the term user refers to a person that is putting on or adjusting a sandal; in this case the user does not necessarily have to be the same person that is wearing the sandal. For example, a parent may adjust a child's sandal. A user may wear a sandal of the present invention for a variety of purposes including running, walking and standing or working; while many of the examples pertain to the use of a sandal of the present invention for the purpose of running the subject invention is not so limited.

The "interior" side of a foot, a shoe, a sandal, or a sole of a shoe or sandal, is the side that is closer to the other foot when a wearer is standing with both feet on the ground and with legs uncrossed. The exterior side is the side further from the other foot for a wearer in the same stance.

The sole of a shoe or sandal has an underside or bottom that makes contact with the ground and a topside or top that is in contact with a user's foot.

The terms strap, lace, or cord refer to a length of material that secures a foot in position on top of the sole of a sandal. As used herein, the term strap covers all types and shapes of material used for this purpose including flat straps, as well as materials with a circular, elliptical, or other regular or irregular cross section.

Figure 1:
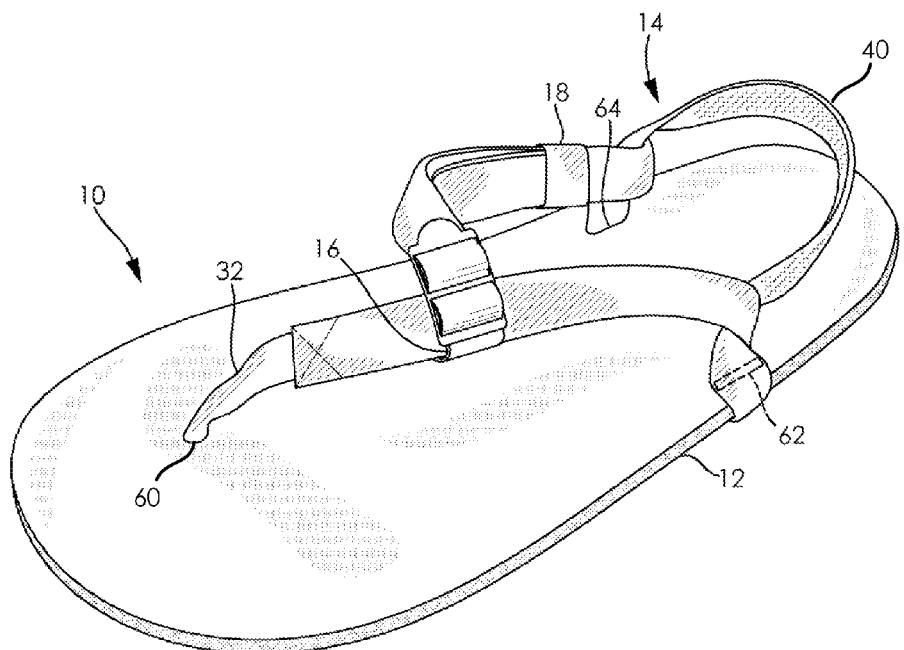
FIG. 1 is a top isometric view of a sandal, according to the present invention.

FIG. 1 is a top isometric view of a preferred embodiment of a sandal 10. Sandal 10 includes a sole 12 that has a front where a user's toes rest and a back where a user's heel rests, and an interior side and an exterior side. Sandal 10 further includes a strap 14, a buckle assembly 16 and a strap coupler loop 18. Strap 14 is formed of a plurality of sections, including a toe section 32 and a heel section 40. Strap 14 is described in further detail hereinbelow with reference to FIG. 3. Sole 12 has three openings through which strap 14 passes, a front opening 60 near the front of the sandal, an exterior opening 62 towards the back exterior of the sandal and an interior opening 64 towards the back interior of the sandal.

Figure 2:
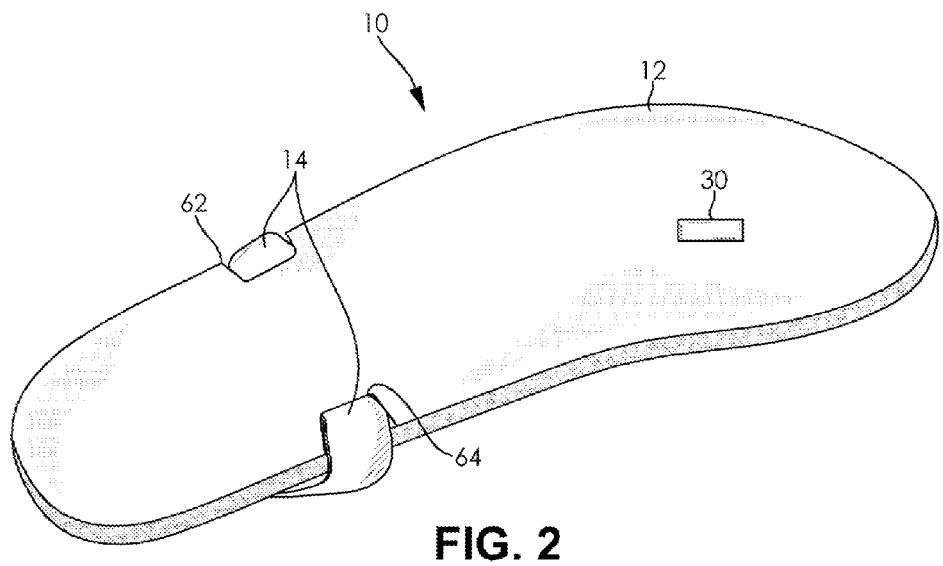
FIG. 2 is a bottom isometric view of the sandal of FIG. 1.

FIG. 2 is a bottom isometric view of sandal 10. Depicted in FIG. 2 are portions of strap 14 as they pass through opening 62 and 64, and a head or termination of strap 14 in the form of a stop-plug 30, connected to toe section 32, which secures one end of strap 14 to the underside of sole 12.

Figure 3:
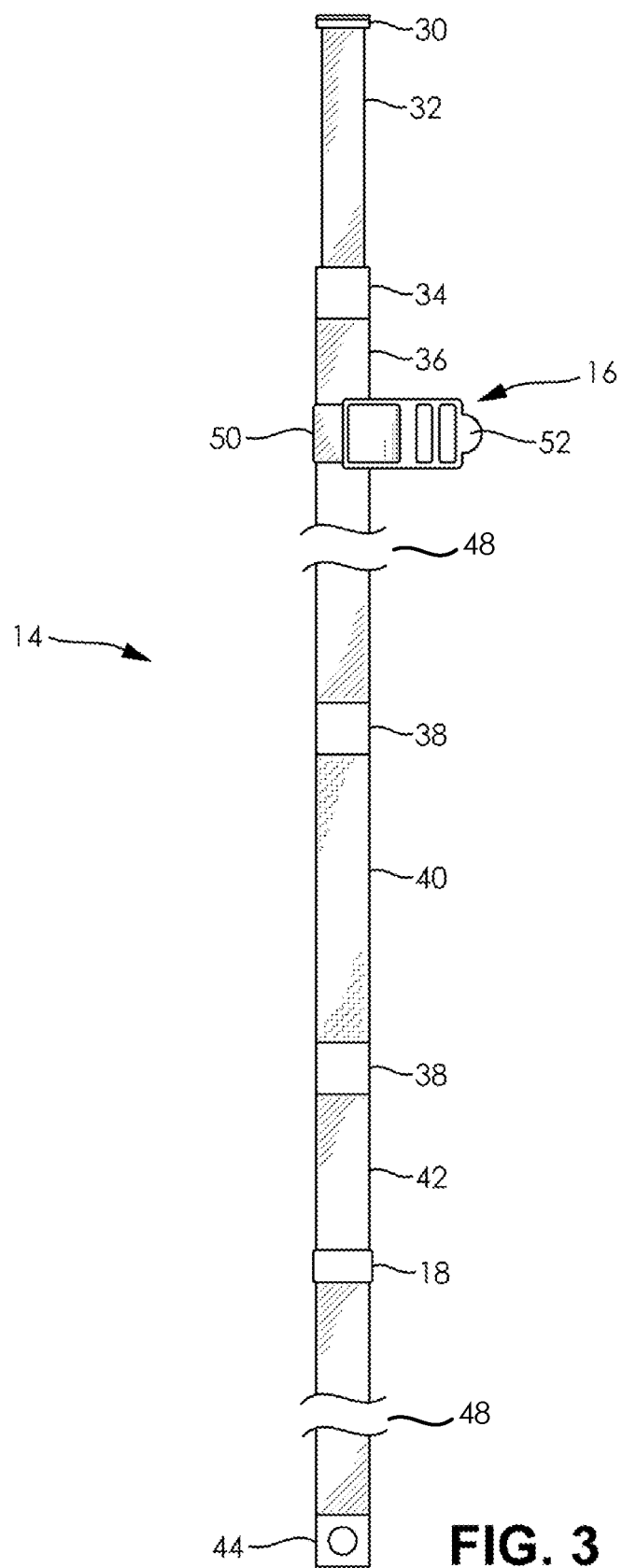
FIG. 3 is a plan view of the strap of the sandal of FIG. 1.

Referring to FIG. 3, strap 14 includes a head at one end of strap 14 in the form of stop-plug 30, a toe section 32, a first joint 34, a front instep section 36, heel section 40, buffered between two joints 38, a final instep section 42, and a final tab 44 at the other end of strap 14. A variable length indicator 48 is shown in both front instep section 36 and final instep section 42 to indicate that these sections are typically longer than depicted in FIG. 3.

A buckle assembly 16 attaches, or couples, to strap 14 via a material loop 50 that encircles strap 14 in front instep section 36. Buckle assembly 16 further includes a buckle 52. In a preferred embodiment, final tab 44 and a portion of final instep section 42 are inserted through buckle 52. Buckle 52 serves to retain one end of strap 14 while the other end is retained by stop-plug 30. In other embodiments, buckle 52 may be a different type of mechanism that secures one end of strap 14 such as inter alia a clasp or frame-and-prong.

In a preferred embodiment, buckle assembly 16 may slide along final instep section 42 to relieve pressure or tension that results from a foot pressing against final instep section 42. The ease with which buckle assembly 16 slides can be regulated through the choice of material used for final instep section 42 and the tightness of material loop 50 around final instep section 42.

Thus, in a preferred embodiment, strap 14 includes 4 interconnected sections, i.e. (1) toe section 32, (2) front instep section 36, (3) heel section 40, and (4) final instep section 42. It may be appreciated by one skilled in the art that in different embodiments strap 14 may include more or less sections without departing from the scope and spirit of the invention. In particular, toe section 32 and front instep section 36 may be combined into a single front section.

It may further be appreciated by one skilled in the art that the length of strap 14 is based on the size of sandal 10. Further, the lengths of individual sections of strap 14 are selected so as to position them correctly relative to the foot of a user. Further, sandal 10 may be made in various sizes. Table 1, below, indicates a preferred embodiment for the length of front instep section 36, heel section 40 and final instep section 42 for three sizes of sandals: small, medium, and large.

TABLE 1

Section Lengths for Various Sizes of Sandal

| Sandal Size | Front Instep 36 | Elastic Heel 40 | Final Instep 42 |
|---|---|---|---|
| Small | 10 | 2¾ | 13½ |
| Medium | 10¼ | 3 | 14 |
| Large | 10¾ | 3¼ | 14½ |

Section Length (in inches)

In a preferred embodiment, toe section 32, front instep section 36 and final instep section 42 are made of woven leather, heel section 40 is made of elasticized leather, and stop plug 30 is made of rubber. Sole 14 may be made of rubber, or rubber with a suede or leather insole. The term elasticized leather refers to a material in which leather is wrapped around elastic. It may also be referred to generically as covered elastic. In other embodiments, heel section 40 may be constructed of rubber, or elasticized nylon. In other embodiments, heel section 40 may be constructed of a material such as nylon or another synthetic material that is designed to reduce or minimize stretch under load. In other embodiments, any or all of toe section 32, front instep section 36, heel section 40 and final instep section 42 may be made of nylon, another synthetic material, leather or hemp. It may be appreciated by one skilled in the art that the material from which each section of strap 14 is constructed may be freely and independently chosen based on criteria such as utility, comfort, and aesthetics without departing from the scope and spirit of the invention. This multi-segment approach is a unique aspect of the design of strap 14 and solves a variety of problems associated with prior art sandals. Notwithstanding the above, a general object of various embodiments of the subject invention is for heel section 40 to be more flexible than other sections of strap 14 to cope with the more several stress placed on this section during running or walking.

In a preferred embodiment, consecutive segments are woven together and protected with a joint. In other embodiments, some sections may be attached to a joint or connected in other ways. For example, sections may be sewn, glued or stapled.

Referring to FIG. 4, to assemble sandal 10, strap 14 is threaded through front opening 60 and is thus secured in front by stop-plug 30. Strap 14 is extended toward the exterior side of sole 12, and is threaded downward through slot 62, is brought up over the exterior side of sole 12 and threaded through the opening between strap 14 as it extends from front opening 60 to exterior opening 62, and sole 12.

Referring to FIG. 5, strap 14 is looped elliptically along the contour of the heel of sandal 10.

Referring to FIG. 6, a similar threading operation is performed with respect to interior opening 64 as was performed with respect to exterior opening 62. Namely, strap 14 is extended toward the interior side of sole 12, is threaded downward through slot 64, is brought up over the exterior side of sole 12 and threaded through the opening between strap 14 as it extends from front opening 60 to interior opening 64, and sole 12.

Referring to FIG. 7, final tab 44 is threaded through buckle 52 and pulled by a user to a desired degree of tightness. At any time, the user can tighten the degree to which strap 14 tightens around his/her foot by pulling final tab 44 or final instep section 42. The reverse operation serves to loosen strap 14 around the user's foot and also serves to remove strap 14 entirely from sole 12.

Skilled persons will now appreciate many advantages of the preferred embodiment over prior art sandals. First, buckle assembly 16 can slide on strap 14, so that this junction can find a comfortable and secure place on the user's instep. The human instep is notoriously varied in shape, making it difficult to fit footwear with precision. The preferred embodiment provides enough variation so that a user can configure a good instep fit. Moreover, the buckle provides a single, easy to use adjustment for an overall strap tightening, thereby facilitating this step.

Also, heel section 40, which in one preferred embodiment is made of elasticized leather, is in certain embodiments designed to stretch elastically to accommodate the natural variation in the foot's size and shape during running. Without this accommodation, the strap 14 may tend to be pulled during the foot's motion and change shape during running, eventually causing heel section 40 to loosen from the wearer's heel and potentially slip off. In embodiments where an elastic material is used for heel section 40, heel section 40 permits the strap to vary in length during running, thereby accommodating the foot's changing shape, without loosening over time, but consistently contracting back to be held in place on the wearer's heel, even during running.

In addition, toe section 32 can bend onto itself transversely, so that it does not cause discomfort between the toes. Instep sections 36 and 42 are made of a strong material, which in a preferred embodiment is stiff in comparison to the toe section material 32. This avoids any transverse folding, which would be unpleasant and might force a runner to stop, in order to adjust his strap.

The fact that strap 14 can be withdrawn from the sole 12, facilitates the replacement of the strap 14, with alternative strap forms, such as a leather strap, a rope strap, or a strap made of nylon material or other synthetic material, but having different dimensions. Also, in one preferred system of materials, different colored leather and rope laces are provided. Accordingly, with a single sole, a user may change the appearance of the sandal or adjust the function of the sandal for different circumstances by removing the installed straps and installing others, such as rope straps, hemp straps, leather straps, the high tech nylon multi-part strap described above, or other straps by simply removing one pair of laces and installing another.

While a number of exemplary aspects and embodiments have been discussed above, those possessed of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

Securement Strap Embodiments

FIGS. 8 and 9 illustrate an embodiment of a sandal 100, according to the present invention, that includes a secondary strap, referred to herein as a securement strap 110 that crosses over the foot. Sandal 100 differs from sandal 10, depicted in FIGS. 1-7 in that securement strap 110 is secured from heel section 40 on the exterior side of the foot to heel section 40 on the interior side of the foot. On the exterior side of the foot securement strap 110 has a first attachment mechanism 120. On the interior side of the foot securement strap 110 has a second attachment mechanism 130. In certain embodiments first attachment mechanism 120 and second attachment mechanism 130 are identical or nearly so. In other embodiments first attachment mechanism 120 and second attachment mechanism 130 are substantially different mechanisms. Two attachment mechanisms that use a hook and loop attachment mechanism, such as a VELCRO style hook and loop mechanism, are described hereinbelow.

In relation to strap 14 of sandal 10, securement strap 110 may be considered as a secondary strap while strap 14 may be considered as a primary strap.

The primary function of securement strap 110 is to secure the heel of sandal 100 to the user's foot, thus reducing movement, separation or play of the sandal, and specifically the heel of sandal 100, relative to the foot. When strap 110 is snugly fitted it prevents heel section 40 from slipping downward on the heel. While FIGS. 8 and 9 illustrate securement strap 110 as an accessory to sandal 10, in fact securement strap 110 is not so limited. Generally, securement strap 110 may attach to a broad range of sandals and other shoes and items of apparel and serve a comparable purpose. Further, while securement strap 110 is illustrated herein as attaching to a single, primary, strap it is not so limited. Thus, in certain embodiments securement strap 110 may attach to a sandal that has several straps, or that has no straps at all.

The placement and design of strap 110 is such that the foot can typically be slipped in and out of sandal 100 even when strap 110 is attached.

Securement strap 110 typically has a plurality of sections. These typically include a comfortable over foot section that fits over a user's foot and an attachment section, or simply attachment, at each end of the strap that enable the strap to be attached on both the exterior side and interior side of heel section 40.

Securement strap 110 is typically fabricated from one or more materials that are either inflexible or mildly flexible, such as plastic, leather, nylon, or other synthetic material. For example, in one embodiment, described hereinbelow with reference to FIG. 10, attachment sections are made of VELCRO or have straps of VELCRO sewn or otherwise affixed to them while the over foot section is made of nylon or another synthetic material, without VELCRO. VELCRO refers to a patented hook and loop type of fastener that is provided by VELCRO INDUSTRIES, B.V. The U.S. component of VELCRO INDUSTRIES is VELCRO USA Inc. of Manchester, N.H.

Securement strap 110 may be manufactured in various lengths to accommodate different size feet. In one embodiment, lengths provided include a small length of substantially 12-14", a medium length of substantially 14-16", a large length of substantially 16-18", and an extra large length of substantially 17-20". Thus, lengths are roughly in the 12"-20" range with 14" to 17" being the preferred size range to accommodate most feet. The over foot section is typically in the range of 4 inches to 8 inches in length. A desirable width of securement strap 110 is ½ inch but generally widths in the range of ¼ inch to 1 inch are acceptable. In embodiments where securement strap 110 is a cord then typical cord diameters are ⅛" to ⅜", although any diameter of cord is acceptable provided it is large enough to be comfortable but not so large as to interfere with the motion of the user's ankle. The length of the attachment sections depend on the type of attachments.

One embodiment that uses a hook and loop type of fastener, such as a VELCRO fastener, to attach each end of securement strap 110 to heel section 40 is described hereinbelow with reference to FIG. 10. Other methods of attachment may also be used including inter alia snaps, buttons, clamps, knots and buckles.

Figure 10:
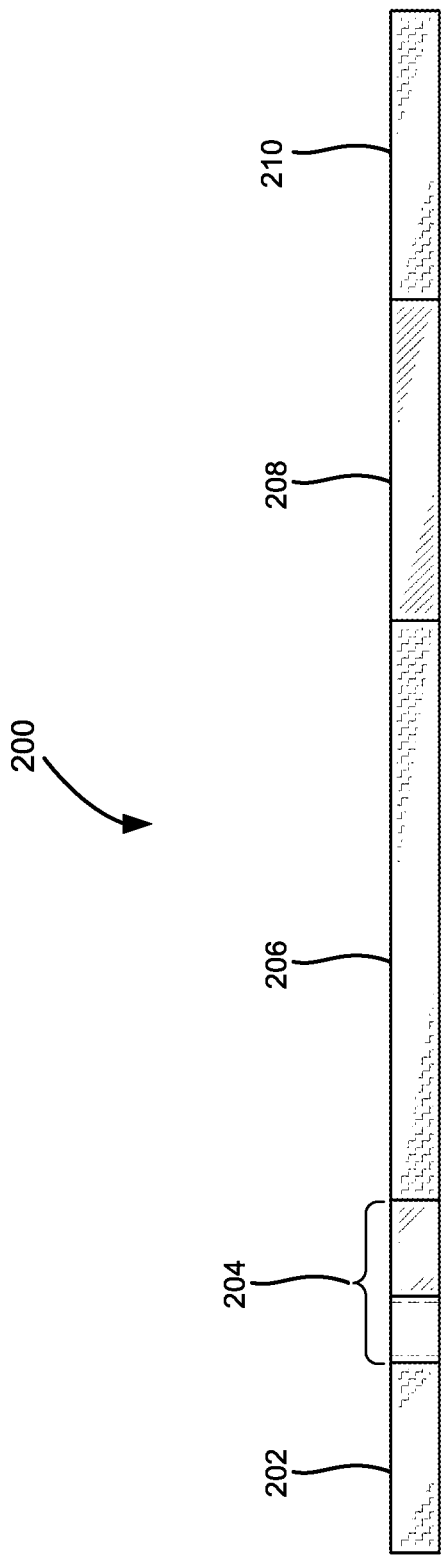
FIG. 10 is an illustration of an embodiment of a securement strap.

FIG. 10 is an illustration of an embodiment of securement strap 110. This exemplary embodiment of securement strap 110 is referred to as securement strap 200 and includes a plurality of sections, including a first loop section 202, a first strap covering section 204, an over foot section 206, a second strap covering section 208 and a second loop section 210. It may be appreciated that one side of over foot section 206 presents a hook and loop type of fastener, such as VELCRO, hooks while the reverse side does not include hooks and is smooth and comfortable for the user as it makes direct contact with the foot.

In one embodiment, first loop section 202 wraps around the exterior side of heel section 40 and couples or adheres to over foot section 206. First strap covering section 204 wraps over and makes contact with exterior heel section 40. On one side, over foot section 206 wraps over the user's foot and makes contact with the foot. On the other side, over foot section 206 presents hooks, such as VELCRO brand hooks, and makes contact with and attaches to first loop section 202 on one side and second loop section 210 on the other side. Second strap covering section 208 wraps over and makes contact with the interior side of heel section 40. Second loop section 210 loops around the interior side of heel section 40 and couples with the hook side of over foot section 206.

Securement strap 200 is a large size that measures 16 inches in length. First loop section 202 measures 1.5 inches in length, first strap covering section 204 measures 1.5 inches in length, over foot section 206 measures 6 inches in length, second strap covering section 208 measures 4 inches, and second loop section 210 measures 3 inches.

The asymmetry between the left and right sides of securement strap 200 allows securement strap 200 to be fitted snugly onto the exterior side of heel section 40 while leaving much larger sections on the interior side to accommodate a wide range of foot sizes. Also, the asymmetry makes it easy for a user to leave the exterior side of securement strap 200 attached and to readily attach and detach the interior side of securement strap 200 when the user takes on and off the sandal. However, as previously mentioned and as borne out in practice users can easily take the sandal on and off while leaving securement strap 200 attached to heel section 40.

While the operational description above indicates that first loop section 202 wraps around the exterior side of heel section 40 and second loop 210 wraps around the interior side of heel section 40, this can be reversed at the option of the user. In this case, first loop section 202 wraps around the interior side of heel section 40 and second loop 210 wraps around the exterior side of heel section 40.

Further, this design allows a tag, such as a tag depicting a logo to be easily incorporated. As illustrated in FIG. 10 first strap covering section 204 includes a tag on the left side of section 204 that is used for a logo design; but in other embodiments a tag or multiple tags may be included in other locations or areas along securement strap 200.

In reading the above description, persons skilled in the art will realize that there are many apparent variations that can be applied to the methods and systems described.

What is claimed is:

1. A sandal comprising:
 a) a sole, having a front region and a back region and an interior side and an exterior side, comprising:
  an interior opening in or near said back region at said interior side;
  an exterior opening in or near said back region at said exterior side; and
  a front opening in said front region;
 b) an adjustable primary strap threaded through said exterior opening, looped around said back region, and threaded through said interior opening, thereby defining a heel section of the primary strap between said interior opening and said exterior opening, wherein the primary strap has a first end that terminates at the bottom of the sole in a stop-plug and a second end that is threaded upwardly through said front opening, threaded downward through said exterior opening, is looped around said back region, and is threaded downward through said interior opening; and
 c) an adjustable securement strap, which attaches on one side to the interior side of the heel section of the primary strap and on the other side to the exterior side of the heel section of the primary strap, that is configured to prevent the heel section from slipping downward on the heel of the foot of a user of the sandal.

2. The sandal of claim 1, wherein said attaching uses a hook and loop style fastener on each end of the securement strap.

3. The sandal of claim 2, wherein the securement strap has an over foot section between the two fasteners that is made of a material selected from the group consisting of leather, nylon and plastic.

4. The sandal of claim 3, wherein the length of the over foot section is substantially between 4" and 8".

5. The sandal of claim 2, wherein the heel section of the primary strap is made of an elastic material.

6. The sandal of claim 1, wherein the length of the securement strap is substantially between 12" and 20".

7. A sandal comprising:
 a) a sole having a front region and a back region and an interior side and an exterior side, comprising: an interior opening in or near said back region at said interior side; and an exterior opening in or near said back region at said exterior side; and a front opening in said front region;
 b) an adjustable primary strap that comprises a first end that terminates at the bottom of the sole in a stop-plug and a second end that is threaded upwardly through said front opening, threaded downward through said exterior opening, looped around said back region, and threaded downward through said interior opening, thereby defining a heel section of the primary strap between said interior opening and said exterior opening;

c) an adjustable securement strap, which attaches on one side to the interior side of the heel section of the primary strap and on the other side to the exterior side of the heel section of the primary strap, that is configured to prevent the heel section from slipping downward on the heel of the foot of a user of the sandal; and d) a buckle assembly that comprises: a buckle, in which the second end terminates, that enables a user to tighten the primary strap around his foot; and a material loop that slidingly couples the buckle to the primary strap.

8. The sandal of claim 7, wherein slidingly coupling the buckle to the primary strap enables the user to adjust the position of the buckle forwards or backwards along the primary strap and consequently the position of the primary strap in relation to the instep of the user's foot as constrained by the location of the interior opening in said back region.

9. The sandal of claim 7, wherein said attaching uses a hook and loop style fastener on each end of the securement strap.

10. The sandal of claim 7, wherein the securement strap has an over foot section between the two fasteners that is made of a material selected from the group consisting of leather, nylon and plastic.

11. The sandal of claim 10, wherein the length of the over foot section is substantially between 4" and 8".

12. The sandal of claim 7, wherein the heel section of the primary strap is made of an elastic material.

13. The sandal of claim 7, wherein the length of the securement strap is substantially between 12" and 20".

\* \* \* \* \*